(12) United States Patent
Lin

(10) Patent No.: US 10,788,391 B2
(45) Date of Patent: Sep. 29, 2020

(54) WATER DRIP TESTING DEVICE

(71) Applicant: GETAC TECHNOLOGY CORPORATION, Hsinchu County (TW)

(72) Inventor: Poh-Sun Lin, Taipei (TW)

(73) Assignee: GETAC TECHNOLOGY CORPORATION, Hsinchu County (TW)

( * ) Notice: Subject to any disclaimer, the term of this patent is extended or adjusted under 35 U.S.C. 154(b) by 217 days.

(21) Appl. No.: 16/030,832

(22) Filed: Jul. 9, 2018

(65) Prior Publication Data
US 2019/0293515 A1   Sep. 26, 2019

(30) Foreign Application Priority Data
Mar. 23, 2018   (CN) .......................... 2018 1 0244172

(51) Int. Cl.
*G01M 3/02* (2006.01)
*G01R 31/00* (2006.01)
(52) U.S. Cl.
CPC ............. *G01M 3/02* (2013.01); *G01R 31/003* (2013.01)
(58) Field of Classification Search
CPC ................................ G01M 3/02; G01R 31/003
See application file for complete search history.

(56) References Cited

U.S. PATENT DOCUMENTS

| 7,904,259 | B2 * | 3/2011 | Shinoda | G01M 3/26 702/51 |
| 9,733,150 | B2 * | 8/2017 | Fan | G01M 3/34 |
| 2009/0178469 | A1 * | 7/2009 | Tseng | G01M 3/10 73/45.5 |
| 2016/0255953 | A1 * | 9/2016 | Bonaduce | A47B 61/04 |
| 2017/0023916 | A1 * | 1/2017 | Dupertuis | G01M 3/02 |

FOREIGN PATENT DOCUMENTS

KR    20120064173 A  *  6/2012  .............. G01N 3/34

OTHER PUBLICATIONS

Machine translation of KR2012-0064173 (Year: 2012).*

* cited by examiner

*Primary Examiner* — Natalie Huls (57) ABSTRACT

A water drip testing device includes a frame member, a water tank, a drip member, a first carrying member and a second carrying member. The frame member includes an upper portion, a lower portion, and a frame body between the upper and lower portions. The water tank includes a lower plate provided at the top portion. The drip member is connected to the lower plate and communicates with the water tank. The first carrying member is detachably connected to the frame body, and includes a first carrying surface facing the drip member. The second carrying member is detachably connected to the frame body, and includes a second carrying surface facing the drip member. When the water drip testing device is in a first or second test mode, the first or second carrying member is installed on the frame body.

9 Claims, 6 Drawing Sheets

WATER DRIP TESTING DEVICE

CROSS-REFERENCE TO RELATED APPLICATIONS

This application claims priority from China Patent Application No. 201810244172.1, filed on Mar. 23, 2018, the entire disclosure of which is hereby incorporated by reference.

BACKGROUND OF THE INVENTION

Field of the Invention

The invention relates to a testing device, and more particularly to a water drip testing device.

Description of the Prior Art

Many current electronic devices feature a waterproof function. For example, numerous models of smart phones in the recent years have a waterproof function. According to specific international certifications, the waterproof function for electronic devices are divided into different ratings. Further, different international certifications may differ in testing methods even for similar items.

In the International Protection Marking, IEC 60529, ingress protection ratings are specified. The so-called ingress rating refers to a numerical code in two digits, which respectively represent a solid particle protection capability and a liquid ingress protection capability. Further, the code is in a form of Ipab, where the numerical value of "a" is between 0 and 6 and the numerical value of "b" is between 0 and 8. If an electronic device conforms to an IP67 certification standard in IEC 60529, it means that the electronic device has a solid particle protection capability in a rating of 6 that represents a total dust-proof capability, and a liquid ingress protection capability in a rating of 7 that represents enclosure against water can be maintained for 30 minutes when immerse in water at a depth of 1 meter. Further, if the code of an ingress protection rating of an electronic device is IPXb, the value "X" means that the code does not provide any information of the solid particle protection capability, and only information representing the liquid ingress protection is given. In the United States Military Standard 801G certification, test standards for a liquid ingress protection capability for an electronic device are also specified.

All of the three test standards, namely IPX1, IPX2 and 801G, implement water drip tests on an electronic device. An electronic device under test is placed below a water tank, water is dripped at a predetermined speed from the bottom of the water tank, and the bottom of the water tank and the electronic device are spaced by a predetermined dripping distance in between, so as to simulate a scenario of exposing the electronic device in the rain. However, the dripping speeds of these three test standards are different, and the dripping distances are also different. Thus, to perform the three water drip tests including IPX1, IPX2 and 810G on an electronic device, an electronic device under test needs to be individually placed in water drip testing devices having three different standards in order to conduct the tests.

SUMMARY OF THE INVENTION

As previously stated, in the prior art, water drip testing devices in three different standards need to be provided in order to perform three water drip tests, namely, IPX1, IPX2 and 810G, on an electronic device. The water drip testing devices of these three standards respectively conform to specifications of IPX1, IPX2 and 810G. However, each of these water drip testing device is quite costly and occupy a sizable space, implying that the three water drip testing devices can add up to higher costs and requires a much larger space.

In view of the above, it is an object of the present invention to provide a water drip testing device for enhancing the level of integration as well as reducing costs and a space requirement.

In one embodiment, a water drip testing device includes a frame member, a water tank, a drip member, a first carrying member and a second carrying member. The frame member includes a top portion, a lower portion, and a frame body located between the upper portion and the lower portion. The water tank includes a lower plate, which is provided at the top portion. The drip member is connected to the lower plate, and communicates with the water tank. The first carrying member is detachably connected to the frame body, and includes a first carrying surface facing the drip member, with a first distance existing between the first carrying surface and the drip member. The second carrying member is detachably connected to the frame body, and includes a second carrying surface facing the drip member, with a second distance existing between the second carrying surface and the drip member. The water drip testing device further has a first test mode and a second test mode. When the water drip testing device is in the first test mode, the first carrying member is installed on the frame body and the second carrying member is separate from the frame body; when the water drip testing device is in the second test mode, the second carrying member is installed on the frame body and the first carrying member is separate from the frame body.

In one embodiment, the water tank further includes a side wall, a water inlet portion, a first water outlet portion and a second water outlet portion. The side wall is connected to the lower plate. The water inlet portion includes a water inlet port. The first water outlet portion includes a first water outlet port and a first water stop valve. The second water outlet portion includes a second water outlet port and a second water stop valve. The water inlet port, the first water outlet port and the second water outlet port are located on the side wall. The first water stop valve communicates with the first water outlet port, and the second water stop valve communicates with the second water outlet port. A first water level is present between the first water outlet port and the lower plate, a second water level is present between the second water outlet port and the lower plate, and the first water level is greater than the second water level. When the water drip testing device is in the first test mode, the second water stop valve seals the second water outlet port.

In one embodiment, the water tank further includes a third water outlet portion. The third water outlet portion includes a third water outlet port and a third water stop valve. The third water outlet port is located on the side wall, and the third water stop valve communicates with the third water outlet port. A third water level is present between the third water outlet port and the lower plate, and the second water level is greater than the third water level. When the water drip testing device is in the first test mode, the second water stop valve seals the second water outlet port and the third water stop valve seals the third water outlet port. When the water drip testing device is in the second test mode, the third water stop valve seals the third water outlet port.

In one embodiment, the frame member includes a plurality of fastening portions and a fixing plate. The fastening portions are provided on the frame body and are distributed at intervals between the upper portion and the lower portion. The fixing plate is fastened at one of the fastening portions. Further, the first carrying member or the second carrying member is provided on the fixing plate.

In one embodiment, each of the fastening portions includes a plurality of support rods, the fixing plate includes a plurality of fastening slots, and the support rods of one of the fastening portions are respectively engaged in the fastening slots.

In another embodiment, the support frame includes a plurality of fastening portions, and each of the first carrying member and the second carrying member includes a fixing plate. The fastening portions are provided on the frame body and are distributed at intervals between the upper portion and the lower portion. The fastening plate of the first carrying member is fastened at one of the fastening portions, and the fixing plate of second carrying member is fastened at another of the fastening portions. Further, each of the fastening portions includes a plurality of support rods, and each of the respective fixing plates of the first carrying member and the second carrying member includes a plurality of fastening slots. The support rods of one of the fastening portions are engaged in the fastening slots of the fixing plate of the first carrying member, and the support rods of another of the fastening portions are engaged in the fastening slots of the fixing plate of the second carrying member.

In another embodiment, the frame member includes a fixing plate, a hinge and a pulley. The first carrying member or the second carrying member is provided on the fixing plate, the pulley is located at the upper portion, the hinge surrounds the pulley, and one end of the hinge is connected to the fixing plate.

In one embodiment, the first distance is greater than the second distance, the first carrying member includes a horizontal platform, and the second carrying member includes an inclined platform or a rotatable platform.

In one embodiment, the drip member includes a base and a needle pipe, the lower plate includes a through hole, the base is embedded in the through hole, and the needle pipe is connected to the base and communicates with the water tank.

In conclusion, the water drip testing device disclosed according to the embodiments of the present invention is adapted to different water drip testing standards, providing a higher integration level as well as reducing costs and a space requirement.

The detailed characteristics and advantages of the present invention are given in detailed below in the following embodiments. The disclosure is sufficient for one person skilled in the art to understand and accordingly implement the technical content of the present invention. Based on the disclosure, the scope of claims and the drawings of the application, one person skilled in the art is enabled to easily appreciate related objects and advantages of the present invention.

DETAILED DESCRIPTION OF THE EMBODIMENTS

Figure 1:
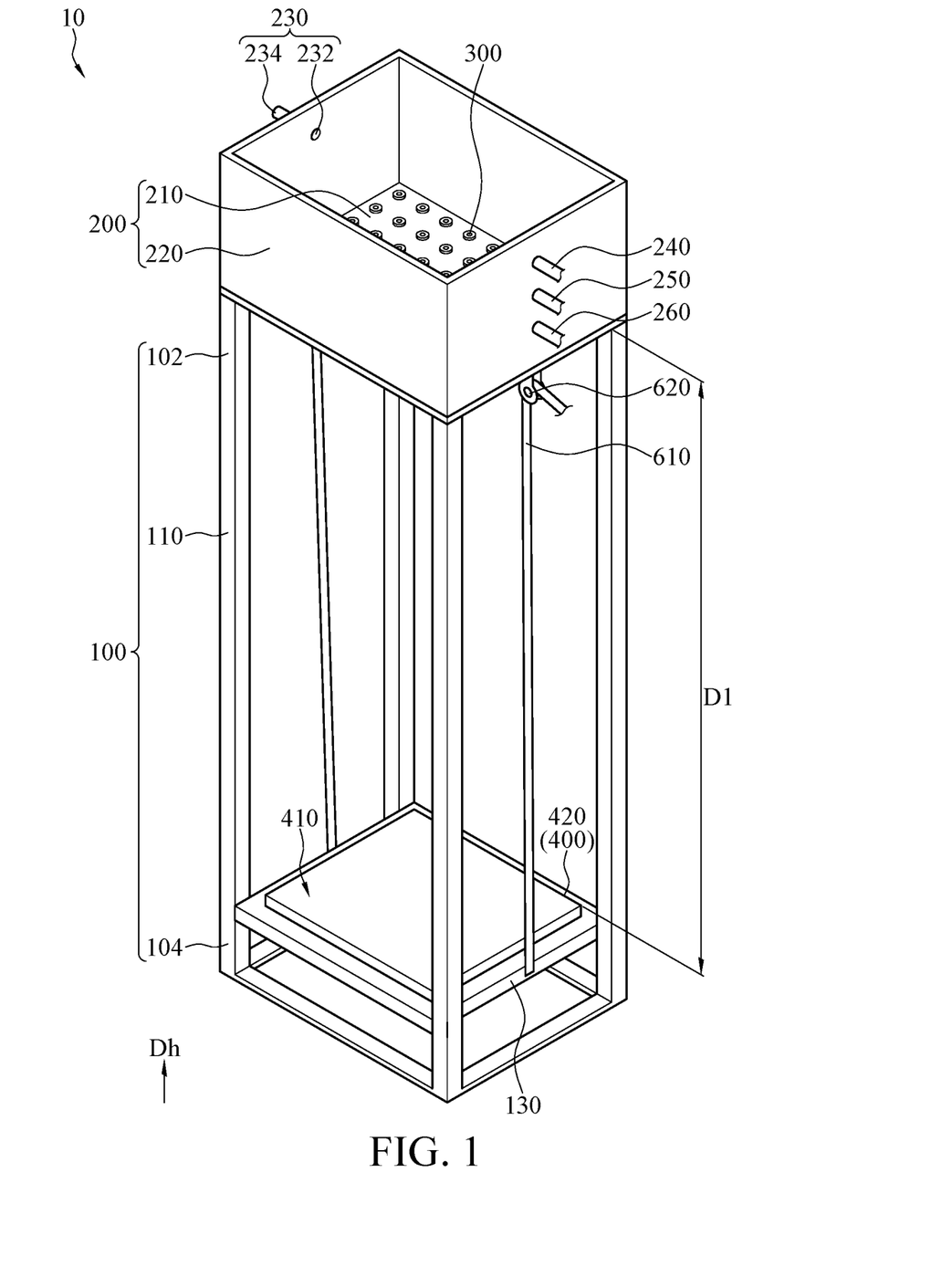
FIG. 1 is a first schematic diagram of a water drip testing device according to an embodiment of the present invention.

Referring to FIG. 1, FIG. 1 shows a schematic diagram of a water drip testing device 10 according to an embodiment of the present invention. In this embodiment, the water drip testing device 10 may perform water drip tests on an electronic device, wherein the water drip tests conform to, for example but not limited to, three test standards including IPX1, IPX2 and 810G. In this embodiment, the water drip testing device 10 includes a frame member 100, a water tank 200, a drip member 300 and a first carrying member 400. The frame member 100 includes an upper portion 102, a lower portion 104 and a frame body 110. The frame body 110 is located between the upper portion 102 and the lower portion 104. The water tank 200 includes a lower plate 210, which is provided at the upper portion 102. The drip member 300 is connected to the lower plate 210 and communicates with the water tank 200. Further, the drip member 300 is embedded on the lower plate 210 and passes through the lower plate 210. The first carrying member 400 is detachably connected to the frame body 110, and includes a first carrying surface 410 facing the drip member 300, with a first distance D1 existing between the first carrying surface 410 and the drip member 300. Water in the water tank 200 may pass through the drip member 300 to drip and evenly distribute on the first carrying surface 410. Further, a dripping speed may be adjusted through the water tank 200, with associated details to be described shortly.

When a water drip test is performed, an electronic device under test may be placed on the first carrying surface 410, and the dripping speed of the drip member 300 is maintained at a specific value. The electronic device continuously receives dripping water on the first carrying surface 410 to simulate exposure to the rain for a continuous predetermined test time period. After the predetermined test time period ends, testing staff takes the electronic device out from the water drip testing device 10, and performs various electrical examinations to determine whether the electronic device is functional. The dripping speed, the test time period and the first distance D correspond to specifications of specific water drip tests, e.g., specifications of a 810G water drip test. Associated details are to be given shortly.

Figure 2:
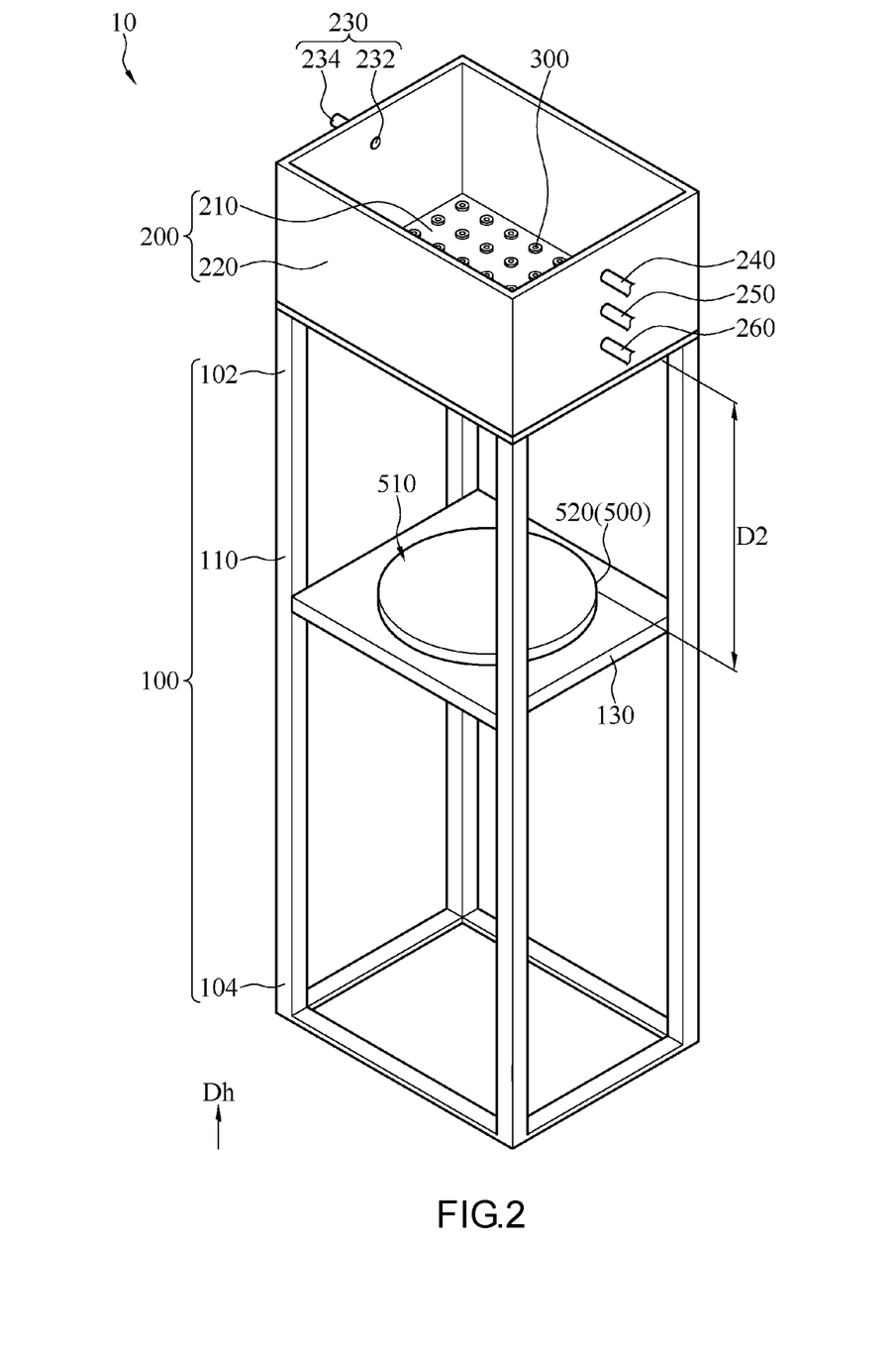
FIG. 2 is a second schematic diagram of a water drip testing device according to an embodiment of the present invention.

Referring to FIG. 2, FIG. 2 shows a second schematic diagram of a water drip testing device 10 according to an embodiment of the present invention. In this embodiment, the water drip testing device 10 further includes a second carrying member 500. The second carrying member 500 is detachably connected to the frame body 110, and includes a second carrying surface 510 facing the drip member 300, with a distance D2 existing between the second carrying surface 510 and the drip member 300. Correspondingly, when a water drip test is performed, an electronic device under test may be placed on the second carrying surface 510. Further, in this embodiment, the first distance D1 is greater than the second distance D2. Because the dripping speed may be adjusted through the water tank 200 and the test time period is also controllable (e.g., the electronic device is removed from below the water tank 200 after the required test time period is reached), the dripping speed, the test time period and the second distance D2 of the water drip testing device 10 shown in FIG. 2 may correspond to specifications of another water drip test, e.g., specifications of an IPX1 water drip test. Associated details are to be described shortly.

As shown in FIG. 1 and FIG. 2, in this embodiment, using the detachable first carrying member 400 and second carrying member 500, the adjustable dripping speed and the controllable test time period, the water drip testing device 10 is able to correspond to specifications of at least two types of water drip tests. In other words, the water drip testing device 10 may have a first test mode and a second test mode. When the water drip testing device 10 is in the first mode, the water drip testing device 10 may be configured as shown in FIG. 1. More specifically, at this point, the first carrying member 400 is installed on the frame body 110, and the frame body 110 is installed with only the first carrying member 400 but not the second carrying member 500; that is, testing staff may separate the second carrying member 500 from the frame body 110. Further, when in the first test mode, an electronic device under test is placed on the first carrying surface 410. When the water drip testing device 10 is in the second test mode, the water drip testing device 10 may be configured as shown in FIG. 2. More specifically, at this point, the second carrying member 500 is installed on the frame body 110, and testing staff may separate the first carrying member 400 from the frame body 110. Further, in the second test mode, an electronic device under test is placed on the second carrying surface 510. In some embodiments, because the second carrying member 500 is located between the first carrying member 400 and the water tank 200, in the second test mode, the first carrying member 400 may also be concurrently installed on the frame body 110 without affecting the implementation of the second test mode.

As shown in FIG. 1 and FIG. 2, in this embodiment, the frame member 100 further includes a fixing plate 130. The fixing plate 130 is detachably installed on the frame body 110, and the first carrying member 400 and the second carrying member 500 are fixed on the frame body 110 through the fixing plate 130. As shown in FIG. 1, in this embodiment, the first carrying member 400 includes a horizontal platform 420, which is placed on the fixing plate 130. Further, the first carrying surface 410 is an upper surface of the horizontal platform 420, and the upper surface of the horizontal platform 420 is horizontal relative to the ground surface on which the frame member 100 is placed. In the specifications of the 810 water drip test, an electronic device under test needs to be maintained still in horizontal during the process of the water drip test, and so the horizontal platform 420 may correspond to the specifications of the 810G water drip test. As shown in FIG. 2, in this embodiment, the second carrying member 500 includes a rotatable platform 520, which is placed on the fixing plate 130. The second carrying surface 510 is an upper surface of the rotatable platform 520, and the upper surface of the rotatable platform 520 is horizontal relative to the ground surface on which the frame member 100 is placed. Further, the upper surface of the rotatable platform 520 is rotatable. For example, the rotatable platform 520 includes therein a motor and a rotation shaft, the rotation shaft is connected to the upper surface of the rotatable platform 520 and the motor, and the motor is able to drive the upper surface of the rotatable platform 520 to rotate through the rotation shaft. Correspondingly, when an electronic device is placed on the second carrying surface 510, the electronic device is driven along with the upper surface of the rotatable platform 520 to rotate. In the specifications of the IPX1 water drip test, an electronic device under test needs to maintained in horizontal while continuously rotating during the process of the water drip test, and so the rotatable platform 520 may correspond to the specifications of the IPX1 water drip test.

Figure 3:
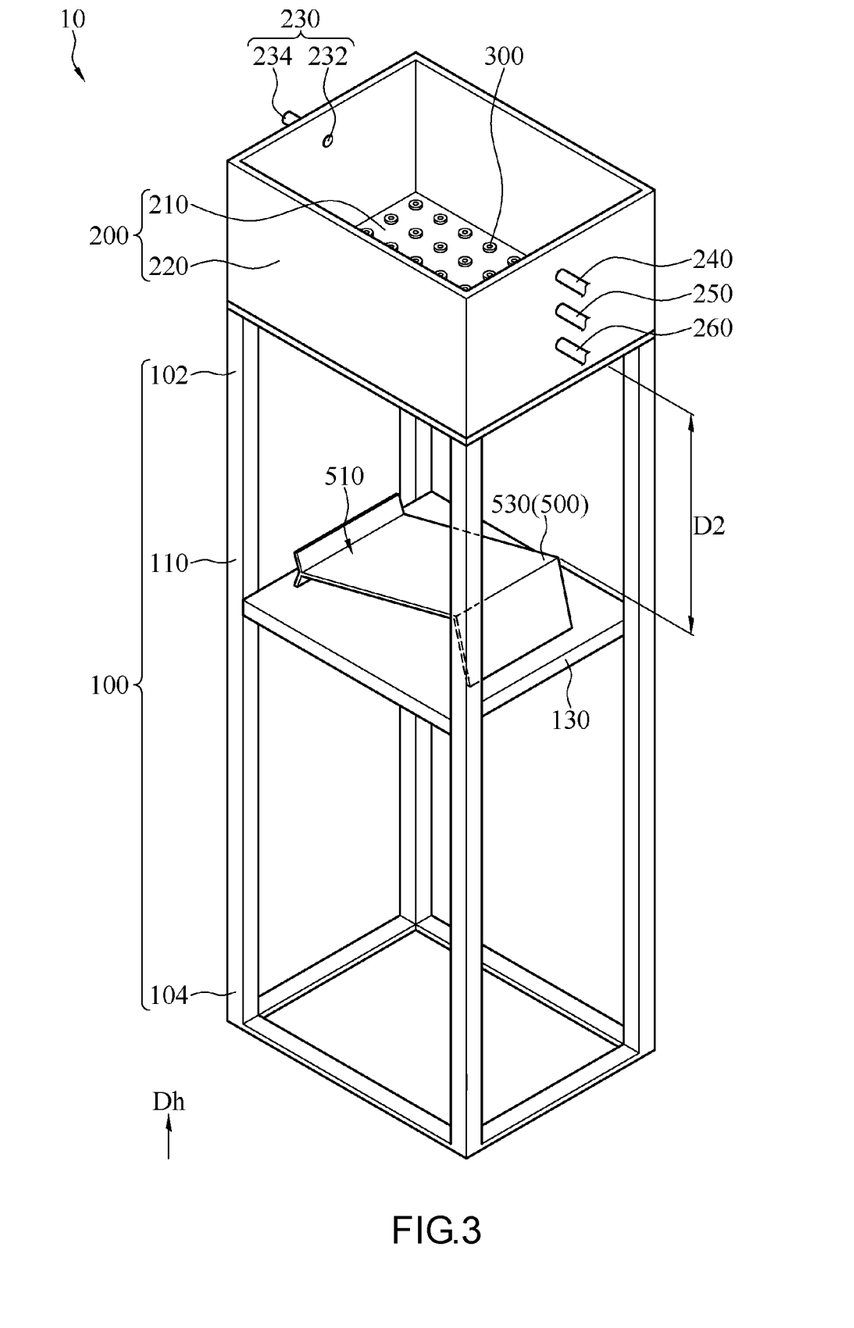
FIG. 3 is a third schematic diagram of a water drip testing device according to an embodiment of the present invention.

Referring to FIG. 3, FIG. 3 shows a third schematic diagram of the water drip testing device 10 according to an embodiment of the present invention. In this embodiment, the second carrying member 500 further includes an inclined platform 530, which is placed on the fixing plate 130. The second carrying surface 510 is an upper surface of the inclined surface 530, and the upper surface of the inclined platform 530 is inclined relative to the ground surface on which the frame member 100 is placed, with an included angle between the upper surface of the inclined platform 530 and the horizontal surface (the ground surface) being approximately 15 degrees. In the specifications of the IPX2 water drip test, an electronic device under test needs to be maintained at an inclined angle of 15 degrees and kept still, and so the inclined platform 530 may correspond to the specifications of the IPX2 water drip test. In this embodiment, because the fixing plate 130 is an independent object separate from the first carrying member 400 and the second carrying member 500, testing staff may replace the second carrying member 500 on the fixing plate 130 according to test requirements by the rotatable platform 520 (as shown in FIG. 2) or the inclined platform 530 (as shown in FIG. 3) to implement water drip tests of different standards.

Figure 4:
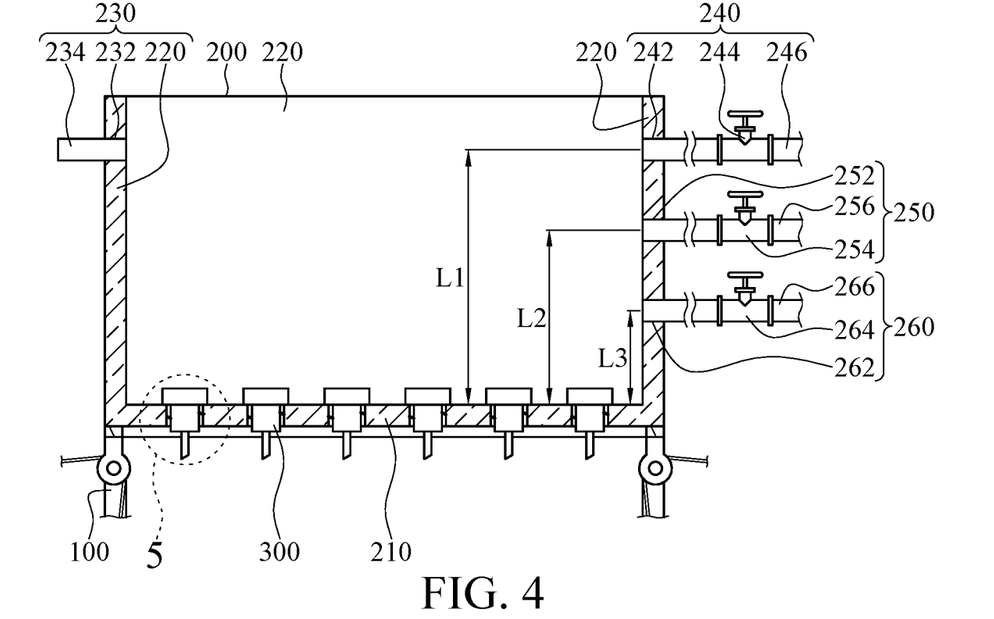
FIG. 4 is a section view of the water drip testing device in FIG. 1.

Referring to FIG. 4, FIG. 4 shows a section view of the water drip testing device 10 in FIG. 1. In this embodiment, the water tank 200 further includes a side wall 220, a water inlet portion 230, a first water outlet portion 240, a second water outlet portion 250 and a third water outlet portion 260. The side wall 220 is connected to the lower plate 210 and surrounds a periphery of the lower plate 210, such that the side wall 220 and the lower plate 210 jointly form a water holding space of the water tank 200. The water inlet portion 230 includes a water inlet port 232 and a water inlet pipe 234. The water inlet port 232 penetrates the side wall 220, and the water inlet pipe 234 is connected to the water inlet port 232 and an external water source. Water from the water source may flow into the water tank 200 through the water inlet pipe 234 and the water inlet port 232.

The first water outlet portion 240 includes a first water outlet port 242, a first water stop valve 244 and a first pipe 246. The first water outlet port 242 penetrates through the side wall 220, the first pipe 246 is connected to the first water outlet port 242 and an external water discharging system, and the first water stop valve 244 communicates with the first water outlet port 242 and is provided on the first pipe 246. When the first water stop valve 244 is open, water in the water tank 200 is allowed to pass through the first water outlet port 242 and the first pipe 246 and flow to the water discharging system; when the first water stop valve 244 is closed, water in the water tank 200 is incapable of flowing to the water discharging system through the first water outlet port 242 and the first pipe 246.

The second water outlet portion 250 includes a second water outlet port 252, a second water stop valve 254 and a second pipe 256. The second water outlet port 252 penetrates through the side wall 220, the second pipe 256 is connected to the second water outlet port 252 and an external water discharging system, and the second water stop valve 254 communicates with the second water outlet port 252 and is provided on the second pipe 256. When the second water stop valve 254 is open, water in the water tank 200 is allowed to pass through the second water outlet port 252 and the second pipe 256 and flow to the water discharging system; when the second water stop valve 254 is closed, water in the water tank 200 is incapable of flowing to the water discharging system through the second water outlet port 252 and the second pipe 256.

The third water outlet portion 260 includes a third water outlet port 262, a third water stop valve 264 and a third pipe 266. The third water outlet port 262 penetrates through the side wall 200, the third pipe 266 is connected to the third water outlet port 262 and an external water discharging system, and the third water stop valve 264 communicates with the third water outlet port 262 and is provided on the third pipe 266. When the third water stop valve 264 is open, water in the water tank 200 is allowed to pass through the third water outlet port 262 and the third pipe 266 to the water discharging system; when the third water stop valve 264 is closed, water in the water tank 200 is incapable of flowing to the water discharging system through the third water outlet port 262 and the third pipe 266.

As shown in FIG. 4, in this embodiment, for example but not limited to, the water inlet port 232 is located on one side of the side wall 220, and the first water outlet port 242, the second water outlet port 252 and the third water outlet port 262 are located on an opposite side of the side wall 200. Further, the first water outlet port 242, the second water outlet port 252 and the third water outlet port 262 have different heights relative to the lower plate 210. In this embodiment, a first water level L1 is present between the first water outlet port 242 and the lower plate 210, a second water level L2 is present between the second water outlet port 252 and the lower plate 210, and a third water level L3 is present between the third water outlet port 262 and the lower plate 210. The first water level L1 is greater than the second water level L2, and the second water level L2 is greater than the third water level L3. Under different water levels, the dripping speed varies due to water pressure. Further, different dripping speeds may correspond to specifications of different water drip tests, with associated details to be given shortly.

Figure 5:
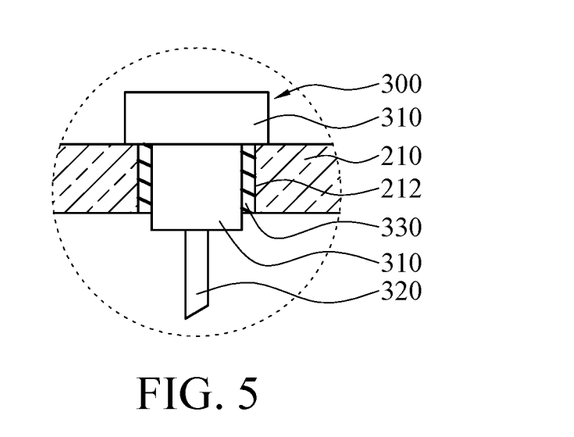
FIG. 5 is an enlarged partial view of a circled section in FIG. 4.

Referring to FIG. 5, FIG. 5 shows an enlarged partial view of a circled section in FIG. 4. It should be noted that, the ratio relationship between the drip member 300 and the water tank 200 and a distribution mode of the drip member 300 on the lower plate 210 in the drawing are only illustrative, and the drip member 300 relative to the water tank 200 may be in a pattern having a smaller size and in greater quantity and density. As shown in FIG. 4 and FIG. 5, in this embodiment, the lower plate 210 includes a plurality of through holes 212, which are evenly distributed on the lower plate 210. The drip member 300 is in a plural quantity, and these drip members 300 are respectively disposed in these through holes 212. More specifically, each drip member 300 includes a base 310 and a needle pipe 320. The base 310 is embedded into the corresponding through hole 212, and the needle pipe 320 is connected to the base 310 and communicates with the water tank 200. Water in the water tank 200 passes through the base 310 and the needle pipe 320, forms a water drop at an exit of the needle pipe 320, and falls onto the first carrying surface 410 or the second carrying surface 510. In this embodiment, when there are a plurality of drip members 300, the dripping speed (in a unit of mm/min) is defined as a water level accumulated per minute by water dripped from all of the drip members 300.

As shown in FIG. 5, in this embodiment, the drip member 300 further includes an elastic element 330, which is provided between the through hole 212 and the base 310. The elastic element 330 helps enhancing the airtightness between the through hole 212 and the base 310, such that water in the water tank 200 is prohibited from exiting through a gap between the through hole 212 and the base 310. In this embodiment, the elastic element 330 may be, for example but not limited to, an O-ring made of rubber.

Figure 6:
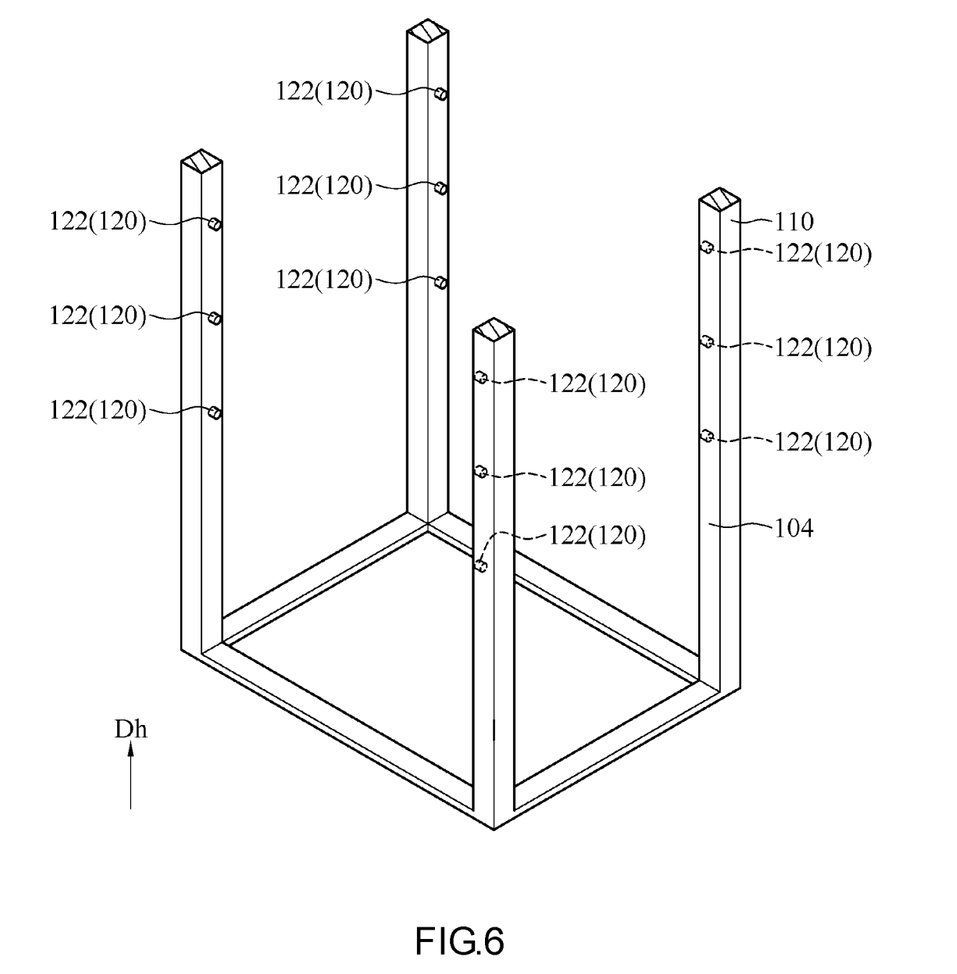
FIG. 6 is a partial schematic diagram of a frame member according to an embodiment of the present invention.
Figure 7:
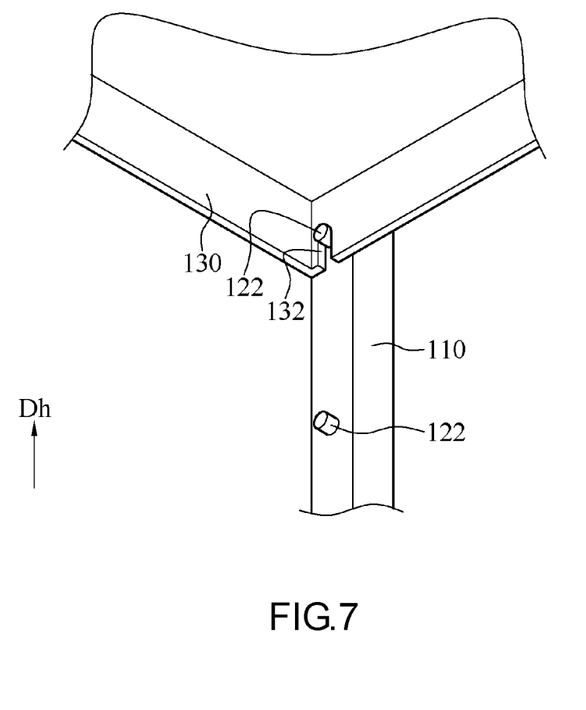
FIG. 7 is a partial schematic diagram of a fixing plate and a frame member engaging each other according to an embodiment of the present invention.

Referring to FIG. 6 and FIG. 7, FIG. 6 shows a partial schematic diagram of the frame member 100 according to an embodiment of the present invention; FIG. 7 shows a partial schematic diagram of the fixing plate 130 and the frame member 100 engaged with each other. The frame member 100 further includes a plurality of fastening portions 120 provided on the frame body 110. The fastening portions 120 are provided along a height direction Dh (as shown in FIG. 1) of the frame body 110, and are distributed at intervals between the upper portion 102 and the lower portion 104. Further, distances of the fastening portions 120 from the lower plate 210 (i.e., distances in the height direction Dh) are different. The fixing plate 130 may be selectively fastened at one of the fastening portions 120, and the first carrying member 400 and the second carrying member 500 may be placed on the fixing plate 130. In other words, testing staff may fasten, according to dripping distances defined by different water drip tests, the fixing plate 130 to an appropriate fastening portion 120. In this embodiment, the dripping distance refers to, for example but not limited to, a distance between the exit of the needle pipe 320 and an electronic device under test.

As shown in FIG. 6 and FIG. 7, each of the fastening portions 120 includes a plurality of support rods 122. For example, each of the fastening portions 120 includes four support rods 122. The four support rods 122 of each of the fastening portions 120 are distributed around the frame body 10. For example, the four support rods 122 are respectively fixed at four supports of the frame body 110, and the four support rods 122 of each of the fastening portions 120 have the same height in the height direction Dh (i.e., the support rods 122 of one fastening portion 120 have the same distance from the lower plate 210). The fixing plate 130 includes a plurality of fastening slots 132 distributed around the fixing plate 130. For example, the fixing plate 130 includes four fastening slots 132, which are respectively provided in a recessed manner at four corners of the fixing plate 130. Positions of these four fastening slots 132 correspond to positions of the support rods 122 of each of the fastening portions 120. When the fixing plate 130 is to fasten with one of the plurality of fastening portions 120, the four fastening slots 132 are first aligned with the four support rods 122 of the fastening portion 120 to be fastened with, the fixing plate 130 is placed downwards to allow the support rods 122 to enter the fastening slots 132, and the fastening process is completed when the support rods 122 are abutted against ends of the corresponding fastening slots 132. At this point, the fixing plate 130 is supported by the four support rods 122 and becomes fixed on the frame body 110.

In different embodiments, the fixing plate 130 may be integrated with the first carrying member 400 and the second carrying member 500. In other words, the first carrying member 400 includes the fixing plate 130, the fixing plate 130 is located at a lower portion of the first carrying member 400, and the fastening slots 132 are located on the fixing plate 130 at the lower portion of the first carrying member 400. Further, the second carrying member 500 similarly includes the fixing plate 130, the fixing plate 130 is located at a lower portion of the second carrying member 500, and the fastening slots 132 are located on the fixing plate 130 at the lower portion of the second carrying member 500. Based on requirements, testing staff may select the first carrying member 400 or the second carrying member 500, and fasten the first carrying member 400 or the second carrying member 500 to the fastening portions 120 having different heights through the fastening slots 132 on the fixing plate 130 of the first carrying member 400 or the second carrying member 500.

In different embodiments, the frame member 100 includes the fixing plate 130, a cable 610 and a pulley 620. The pulley 620 may be secured at the upper portion 102 of the frame member 100, the cable 610 is looped on the pulley 620, and one end of the cable 610 is connected to the fixing plate 130 while the other end may be pulled by testing staff. The pulley 620 and the cable 610 may be implemented with reference to the prior art, and associated details shall be omitted herein. The fixing plate 130 may ascend through the cable 610 and the pulley 620 (the other end of the cable 610 is pulled to cause the fixing plate 130 to move close to the water tank 200) or descend (the other end of the cable 610 is released to cause the fixing plate 130 to move away from the water tank 200). Testing staff may first adjust the fixing plate 130 to an appropriate position through the cable 610 and the pulley 620, and then arrange the first carrying member 400 or the second carrying member 500 on the fixing plate 130. In this situation, the frame member 100 does not need to be provided with the fastening portions 120, nor does the fixing plate 130 need to be provided with the fastening slots 132.

In this embodiment, the water drip testing device 10 may have three test modes—a third test mode in addition to the foregoing first and second test modes. Further, for example but not limited to, the first test mode may correspond to the specifications of the 810G water drip test, the second test mode may correspond to the specifications of the IPX1 water drip test, and the third test mode may correspond to the specifications of the IPX2 water drip test. Settings and operation conditions of the water drip testing device 10 in the first test mode, the second test mode and the third test mode are respectively given below.

As shown in FIG. 1 and FIG. 4, the water drip testing device 10 at this point is in the first test mode. In the specifications of the 810G water drip test, an electronic device under test is required to be placed still in horizontal for a continuous period of 15 minutes during a process of receiving dripping water, the dripping speed is 4.67 mm/min, and the dripping distance is not less than 1 m. Because the dripping speed specified by the 810G is the highest among the dripping speeds specified by the 810G, IPX1 and IPX2, the corresponding water level is also the highest first water level L1. During the test process, the second water stop valve 254 and the third water stop valve 264 are closed to seal the second water outlet port 252 and the third water outlet port 262, and water is allowed to enter through the water inlet port 232 to cause the water level of the water in the water tank 200 to rise to the first water level L1. At this point, when the second water stop valve 254 and the third water stop valve 264 are both closed and the first water stop valve 244 is open, if the speed of incoming water entering through the water inlet port 232 is equal to the speed of outgoing water discharging through the first water outlet port 242 plus the dripping speed of dripping water through the drip member 300, the water level of the water in the water tank 200 reaches a balance and is kept at the first water level L1. Alternatively, when the first water stop valve 244, the second water stop valve 254 and the third water stop valve 264 are all closed, if the speed of incoming water entering through the water inlet port 232 is equal to the dripping speed of dripping water through the drip member 300, the water level of the water in the water tank 200 reaches a balance and is kept at the first water level L1. At the first water level L1, the dripping speed of the water dripping through the drip member 300 is equal to 4.67 mm/min. The dripping speed may be adjusted through the water level, the aperture of the needle pipe 320 and the number of drip member 300. For example, when the aperture of the needle pipe 320 and the number of the drip member 300 are kept constant, the drip member 300 receives a higher pressure as the water level increases and the dripping speed is correspondingly increased.

As previously stated, the distance between the first carrying surface 410 and the drip member 300 is the first distance D1. In the specifications of the 810G water drip test, it is defined that a distance between and electronic device under test and the drip member 300 needs to be more than 1 m. Thus, when an electronic device is placed on the first carrying surface 410, the dripping distance is the first distance D1 subtracted by the height of the top of the electronic device relative to the first carrying surface 410 in the height direction Dh, and the specifications of the 810G are only satisfied when the dripping distance is more than 1 m. If the dripping distance is less than 1 m, a user may adjust the position of the fixing plate 130 in the height direction Dh to cause the dripping distance to be more than 1 m.

As shown in FIG. 2 and FIG. 4, the water drip testing device 10 is in the second test mode at this point. In the specifications of the IPX1 water drip test, an electronic device under test needs to be placed on a horizontal plane and rotate for a continuous period of 15 minutes during the process of receiving dripping water, the dripping speed is 1 mm/min, and the dripping distance is 20 cm. Because the dripping speed specified by the IPX1 is the lowest among the dripping speeds specified by the 810G, IPX1 and IPX2, the corresponding level is the lowest third water level L3. During the test process, regardless of whether the first water stop valve 244 or the second water stop valve 254 is closed, water is allowed to enter through the water inlet port 232 to cause the water level of the water in the water tank 200 to rise to the third water level L3. At this point, when the third water stop valve 264 is open, if the speed of incoming water entering through the water inlet port 232 is equal to the outgoing water discharging through the third water outlet port 262 plus the dripping speed of the water dripping through the drip member 300, the water level of the water in the water tank 200 reaches a balance and is kept at the third water level L3. Alternatively, when the third water stop valve 264 is closed, if the incoming water entering through the water inlet port 232 is equal to the dripping speed of water dripping through the drip member 300, the water level of the water in the water tank 200 reaches a balance and is kept at the third water level L3. At the third water level L3, the dripping speed of water dripping through the drip member 300 is equal to 1 mm/min.

As previously stated, the second carrying member 500 may be a rotatable platform 520, and the distance between the second carrying surface 510 of the rotatable platform 520 and the drip member 300 is the second distance D2. Because the specifications of the IPX1 water drip test define that a distance between an electronic device under test and the drip member 300 needs to be 20 cm, when the electronic device under test is placed on the second carrying surface 510, the dripping distance is the second distance D2 subtracted by the height of the top of the electronic device relative to the height of the second carrying surface 510 in the height direction Dh, leaving the dripping distance to be 20 cm that satisfies the specifications of the IPX1. If the dripping distance is more or less than 20 cm, a user may adjust the position of the fixing plate 130 on the height direction Dh to increase or decrease the second distance D2 to correspondingly cause the dripping distance to be equal to 20 cm.

As shown in FIG. 3 and FIG. 4, the water drip testing device 10 is in the third test mode at this point. In the specifications of the IPX2 water drip test, an electronic device under test needs to be placed still on an inclined surface for a continuous period of 10 minutes during the process of receiving dripping water, the dripping speed is 3 mm/min, and the dripping distance is 20 cm. Because the dripping speed specified by the IPX2 is between the dripping speeds specified by the 801G and the IPX1, the corresponding water level is the intermediate second water level L2. During the test process, the third water stop valve 264 is first closed to seal the third water outlet port 262, and water is allowed to enter through the water inlet port 232 to cause the water level of the water in the water tank 200 to rise to the second water level L2. At this point, when the third water stop valve 264 is closed and the second water stop valve 254 is open, if the speed of incoming water entering through the water inlet port 232 is equal to the speed of outgoing water discharging through the second water outlet port 252 plus the speed of water dripping through the drip member 300, the water level of the water in the water tank 200 reaches a balance and is kept at the second water level L2. Alternatively, when the second water stop valve 254 and the third water stop valve 264 are both closed, if the water of incoming water entering through the water inlet port 232 is equal to the speed of water dripping through the drip member 300, the water level of the water in the water tank 200 reaches a balance and is kept at the second water level L2. At the water level L2, the dripping speed of water dripping through the drip member 300 is equal to 3 mm/min.

As previously stated, the second carrying member 500 is an inclined platform 530, and the distance between the second carrying surface 510 and the drip member 300 is the second distance D2. Because the specifications of the IPX2 water drip test define that the distance between an electronic device and the drip member 300 needs to be 20 cm, when the electronic device under test is placed on the second carrying surface 510, the dripping distance is the second distance D2 subtracted by the height of the top of the electronic device relative to the height of the second carrying surface 510, and is 20 cm. If the dripping distance is more or less than 20 cm, a user may adjust the position of the fixing plate 130 in the height direction Dh to increase or decrease the second distance D2 to correspondingly cause the dripping distance to be equal to 20 cm.

In conclusion, in the water drip testing device according to the embodiments of the present invention, the water level in the water tank can be conveniently modified, and relative positions of the fixing plate and the frame body can also be easily and promptly adjusted to correspond to specifications of different water drip tests. The water drip testing device is capable of performing different water drip tests, thus significantly enhancing the level of integration as well as reducing costs and a space requirement.

While the invention has been described by way of example and in terms of the preferred embodiments, it is to be understood that the invention is not limited thereto. Modifications and similarly arrangements made by one person skilled in the art without departing the spirit of the present invention are to be encompassed within the scope of the present invention. The scope of the present invention therefore should be accorded with the broadest interpretation of the appended claims.

What is claimed is:

1. A water drip testing device, comprising:
a frame member, comprising an upper portion, a lower portion, and a frame body located between the upper portion and the lower portion;
a water tank, comprising a lower plate provided at the upper portion;
a drip member, connected to the lower plate and communicating with the water tank;
a first carrying member, detachably connectable to the frame body, comprising a first carrying surface facing the drip member and adapted to be installed such that a first distance exists between the first carrying surface and the drip member; and
a second carrying member, detachably connectable to the frame body, comprising a second carrying surface facing the drip member and adapted to be installed such that a second distance exists between the second carrying surface and the drip member;
wherein, the water drip testing device has a first test mode and a second test mode; when the water drip testing device is in the first test mode, the first carrying member is installed on the frame body and the second carrying member is separate from the frame body; when the water drip testing device is in the second test mode, the second carrying member is installed on the frame body and the first carrying member is separate from the frame body;
wherein the water tank further comprises a side wall, a water inlet portion, a first water outlet portion and a second water outlet portion; the side wall is connected to the lower plate, the water inlet portion comprises a water inlet port, the first water outlet portion comprises a first water outlet port and a first water stop valve, and the second water outlet portion comprises a second water outlet port and a second water stop valve; the water inlet port, the first water outlet port and the second water outlet port are located on the side wall; the first water stop valve communicates with the first water outlet port, and the second water stop valve communicates with the second water outlet port; the first water outlet port has a first height above the lower plate; the second water outlet port has a second height above the lower plate; the first height is greater than the second height; and when the water drip testing device is in the first test mode, the second water stop valve seals the second water outlet port.

2. The water drip testing device according to claim 1, wherein the water tank further comprises a third water outlet portion; the third water outlet portion comprises a third water outlet port and a third water stop valve; the third water outlet port is located on the side wall, and the third water stop valve communicates with the third water outlet port; the third water outlet port has a third height above the lower plate, and the second height is greater than the third height; when the water drip testing device is in the first test mode, the second water stop valve seals the second water outlet port and the third water stop valve seals the third water outlet port; and when the water drip testing device is in the second test mode, the third water stop valve seals the third water outlet port.

3. The water drip testing device according to claim 1, wherein the frame member comprises a plurality of fastening portions and a fixing plate, the fastening portions are disposed on the frame body and are distributed at intervals between the upper portion and the lower portion, the fixing plate is fastened at one of the fastening portions, and the first carrying member or the second carrying member is provided on the fixing plate.

4. The water drip testing device according to claim 3, wherein each of the fastening portions comprises a plurality of support rods, the fixing plate comprises a plurality of fastening slots, and the support rods of one of the fastening portions are respectively engaged in the fastening slots of the fixing plate.

5. The water drip testing device according to claim 1, wherein the frame member comprises a plurality of fastening portions, each of the first carrying member and the second carrying member comprises a fixing plate, the fastening portions are provided on the frame and are distributed at intervals between the upper portion and the lower portion, the fixing plate of the first carrying member is fastened at one of the fastening portions, and the fixing plate of the second carrying member is fastened at another of the fastening portions.

6. The water drip testing device according to claim 5, wherein each of the fastening portions comprises a plurality of support rods, each of the respective fastening plates of the first carrying member and the second carrying member comprises a plurality of fastening slots, the support rods of one of the fastening portions are respectively fastened in the fastening slots of the fixing plate of the first carrying member, and the support rods of the another of the fastening portions are respectively engaged in the fastening slots of the fixing plate of the second carrying member.

7. The water drip testing device according to claim 1, wherein the drip member comprises a base and a needle pipe, the lower plate comprises a through hole, the base is embedded in the through hole, and the needle pipe is connected to the base and communicates with the water tank.

8. A water drip testing device, comprising:
a frame member, comprising an upper portion, a lower portion, and a frame body located between the upper portion and the lower portion;
a water tank, comprising a lower plate provided at the upper portion;
a drip member, connected to the lower plate and communicating with the water tank;
a first carrying member, detachably connectable to the frame body, comprising a first carrying surface facing the drip member and adapted to be installed such that a first distance exists between the first carrying surface and the drip member; and
a second carrying member, detachably connectable to the frame body, comprising a second carrying surface facing the drip member and adapted to be installed such that a second distance exists between the second carrying surface and the drip member;
wherein, the water drip testing device has a first test mode and a second test mode; when the water drip testing device is in the first test mode, the first carrying member is installed on the frame body and the second carrying member is separate from the frame body; when the water drip testing device is in the second test mode, the second carrying member is installed on the frame body and the first carrying member is separate from the frame body;
wherein the frame member comprises a fixing plate, a cable and a pulley, the first carrying member or the second carrying member is provided on the fixing plate, the pulley is located at the upper portion, the cable is looped on the pulley, and one end of the cable is connected to the fixing plate.

9. A water drip testing device, comprising:
a frame member, comprising an upper portion, a lower portion, and a frame body located between the upper portion and the lower portion;
a water tank, comprising a lower plate provided at the upper portion;
a drip member, connected to the lower plate and communicating with the water tank;
a first carrying member, detachably connectable to the frame body, comprising a first carrying surface facing the drip member and adapted to be installed such that a first distance exists between the first carrying surface and the drip member; and
a second carrying member, detachably connectable to the frame body, comprising a second carrying surface facing the drip member and adapted to be installed such that a second distance exists between the second carrying surface and the drip member;
wherein, the water drip testing device has a first test mode and a second test mode; when the water drip testing device is in the first test mode, the first carrying member is installed on the frame body and the second carrying member is separate from the frame body; when the water drip testing device is in the second test mode, the second carrying member is installed on the frame body and the first carrying member is separate from the frame body;
wherein the first distance is greater than the second distance, the first carrying member comprises a horizontal platform, and the second carrying member comprises an inclined platform or a rotatable platform.

* * * * *